United States Patent [19]

Taylor

[11] Patent Number: 4,800,294

[45] Date of Patent: Jan. 24, 1989

[54] PIN DRIVER CIRCUIT

[75] Inventor: Keith A. Taylor, Portland, Oreg.

[73] Assignee: Tektronix, Inc., Beaverton, Oreg.

[21] Appl. No.: 147,484

[22] Filed: Jan. 25, 1988

[51] Int. Cl.$^4$ .................... H03K 3/023; H03K 5/12
[52] U.S. Cl. ................................ 307/263; 307/264;
  307/270; 307/473
[58] Field of Search ............... 307/262, 263, 264, 270,
  307/473

[56] References Cited

U.S. PATENT DOCUMENTS

| | | | |
|---|---|---|---|
| 3,654,490 | 4/1972 | Kan ................................ | 307/262 |
| 3,656,007 | 4/1972 | Murray .......................... | 307/262 |
| 3,781,689 | 12/1973 | Marshall et al. ............... | 307/262 |
| 4,044,271 | 8/1977 | Symanski et al. .............. | 307/262 |

FOREIGN PATENT DOCUMENTS 0053955  4/1979  Japan ................................ 307/263

*Primary Examiner*—John Zazworsky
*Attorney, Agent, or Firm*—Boulden G. Griffith

[57] ABSTRACT

A pin driver circuit for driving a digital integrated circuit is capable of producing symmetrical rise and fall characteristics, yet is suitable for implementation in monolithic bipolar integrated circuits. This circuit includes a pair of matched transconductance amplifiers, one at each end of an output resistor, connected between a voltage source and a return voltage. Each amplifier has one of a pair of equal resistors between its input terminal and high output terminal to develop an equal swing voltage on alternate ends of the output resistor when a swing voltage current source is switched between the two input resistors by a control signal. The output is taken from the junction between the output resistor and the low output terminal of the amplifier at the high end of the output resistor. An additional current source is connected to the input resistor of the amplifier at the low end of the divider to provide a current which may be adjusted to allow the standing current in the output resistor to be reduced to a satisfactory minimum. Additional circuitry can be added to allow the output to be put in a high impedance condition. In a preferred embodiment, the high level of the output, the swing voltage, and the standing current may all be controlled.

8 Claims, 4 Drawing Sheets

PIN DRIVER CIRCUIT

BACKGROUND OF THE INVENTION

This invention relates to the fields of digital integrated circuit testers and bipolar integrated circuitry, and more particularly to the design of a pin driver circuit for such testers that is suitable for implementation in a monolithic bi-polar n-p-n cell and which has programmable high and low outputs, symmetrical rise and fall times, low output impedance, tri-stateability, and protection against static discharges and short circuiting.

Previously it has been thought that the attainment of a low impedance, completely controllable pin driver output with symmetrical rise and fall times required the use of both n-p-n and p-n-p parts. The need for both n-p-n and p-n-p circuit elements dictated the use of discrete components, or the use of hybrids, or semiconductors with both n-p-n and p-n-p circuit elements wherein the properties of the p-n-p elements were less effective than those of their n-p-n counterparts The all n-p-n circuit that is most frequently used is a pull-up emitter follower in combination with a pull-down current source. However, this circuit lacks rise and fall symmetry, because the fall time arising from the use of the current source varies with the amplitude of the signal according to a linear function, while the emitter follower output varies according to an exponential function with a typical time constant for all amplitude values. If the application is not sensitive to this difference and only one output level is required, this solution is adequate. However, for the pin driver circuitry of an integrated circuit tester with maximum flexibility, it is highly desirable to be able to vary the voltage levels of the output while achieving symmetry between the rising and falling edges of the output waveform.

SUMMARY OF THE INVENTION

A pin driver circuit capable of producing symmetrical rise and fall characteristics includes a pair of matched transconductance amplifiers, one at each end of an output resistor, connected between a voltage source and a return voltage. Each amplifier has one of a pair of equal resistors between its input terminal and high output terminal to develop an equal swing voltage on alternate ends of the output resistor when a swing voltage current source is switched between the two input resistors by a control signal. The output is taken from the junction between the output resistor and the low output terminal of the amplifier at the high end of the output resistor. An additional current source is connected to the input resistor of the amplifier at the low end of the divider to provide a current which may be adjusted to allow the standing current in the output resistor to be reduced to a satisfactory minimum. Additional circuitry can be added to allow the output to be put in a high impedance condition. In a preferred embodiment, the high level of the output, the swing voltage, and the standing current may all be controlled.

An object of the invention is to produce a pin driver output which has symmetrical rise and fall characteristics using a circuit which can be constructed of all n-p-n devices within one integrated circuit cell.

It is a further object of this invention to produce such a circuit while permitting the high voltage level of the output to be varied.

It is a further object of this invention to produce such a circuit while permitting the amount of voltage swing to be varied.

It is a further object of this invention to produce such a circuit which permits the output to be put in a high impedance condition (tri-stated).

It is a further object of this invention to produce such a circuit which can be protected against static discharge.

It is a further object of this invention to produce such a circuit which can be protected against being shorted to either the voltage source or the return voltage.

DESCRIPTION OF THE PREFERRED EMBODIMENT

Figure 1:
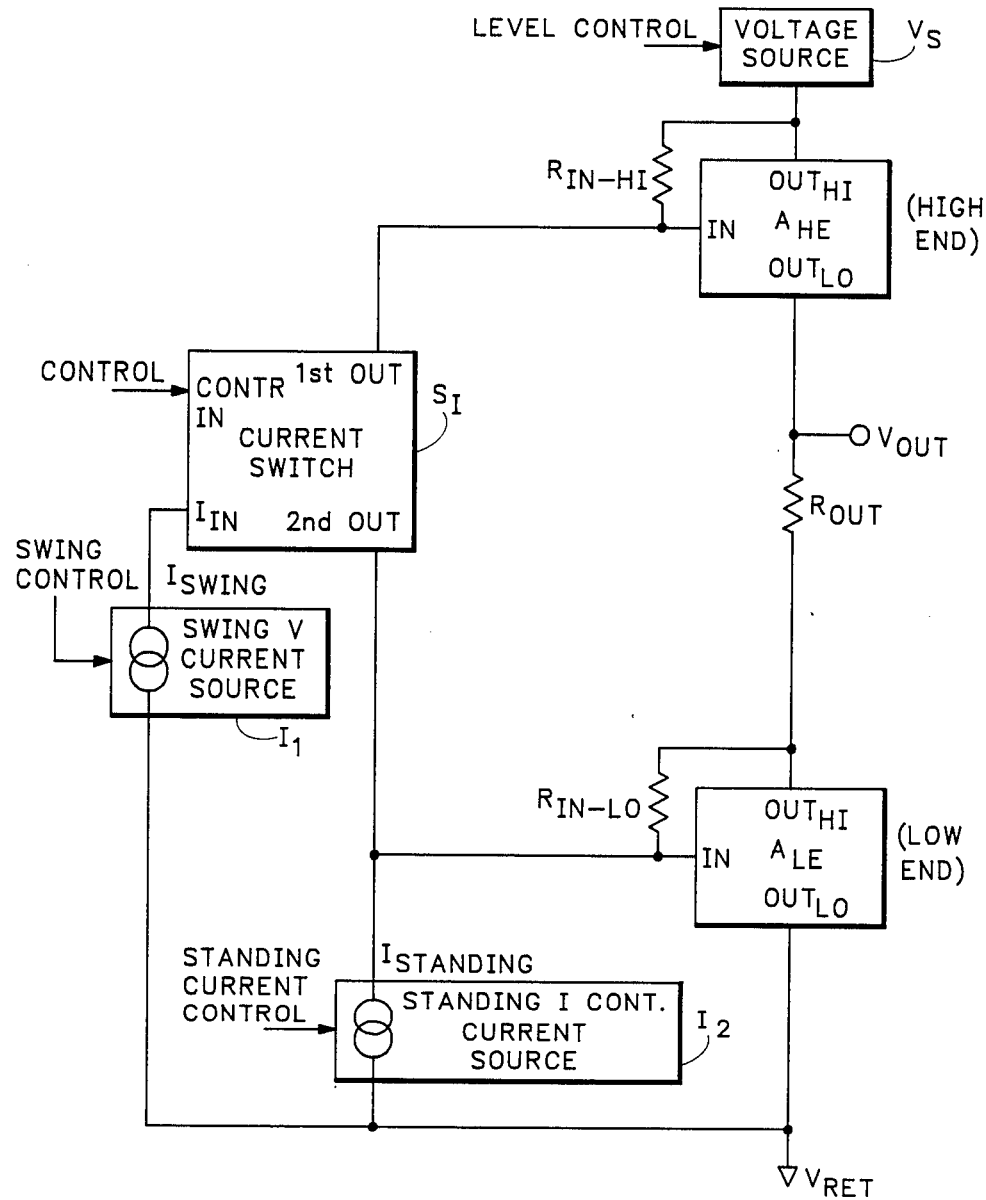
FIG. 1 is a schematic and block diagram of the invention.

Referring to FIG. 1, a voltage divider consisting of two transconductance amplifiers A-he, A-le and an output resistor R-out is connected between a voltage source V-s and return voltage V-ret. Each transconductance amplifier has an input, a high output, and a low output. One of the amplifiers, the high end transconductance amplifier A-he, has its high output connected to the voltage source and its low output connected to the output resistor R-out. The latter point is where the output signal V-out is taken from the circuit.

The other amplifier, the low end transconductance amplifier A-le, has its high output connected to the low end of the output resistor R-out and its low output connected to the return voltage V-ret.

Each transconductance amplifier has an input resistor R-in connected between its input and high output. These two resistors are of equal value. The resistor connected to the high end transconductance amplifier is the high input resistor R-in-hi, while the resistor connected to the low end transconductance amplifier is the low input resistor R-in-lo.

A swing voltage current source I-1 provides a current to the input of a current switch S-I. This current switch S-I has its outputs 1st-out and 2nd-out connected to provide current to either the high input resistor R-in-hi or the low input resistor R-in-lo, depending on the state of a control signal at the input CONTR-in.

A second current source, the standing current control current source I-2, provides an additional current to the low input resistor R-in-lo to allow the standing current through the output resistor R-out to be controlled and suitably minimized.

A level control signal permits adjustment of the voltage source V-s, while a swing control signal determines the amount of swing current I-swing which is directed to one or the other of the input resistors R-in-hi, R-in-lo by current switch S-1 in accordance with the control signal on its input. The voltage swing at the output is the product of the swing current and the values of the (equal) input resistors:

$$\text{V-swing} = \text{V-out-high} - \text{V-out-low} = \text{I-swing} * \text{R-in}$$

Figure 2:
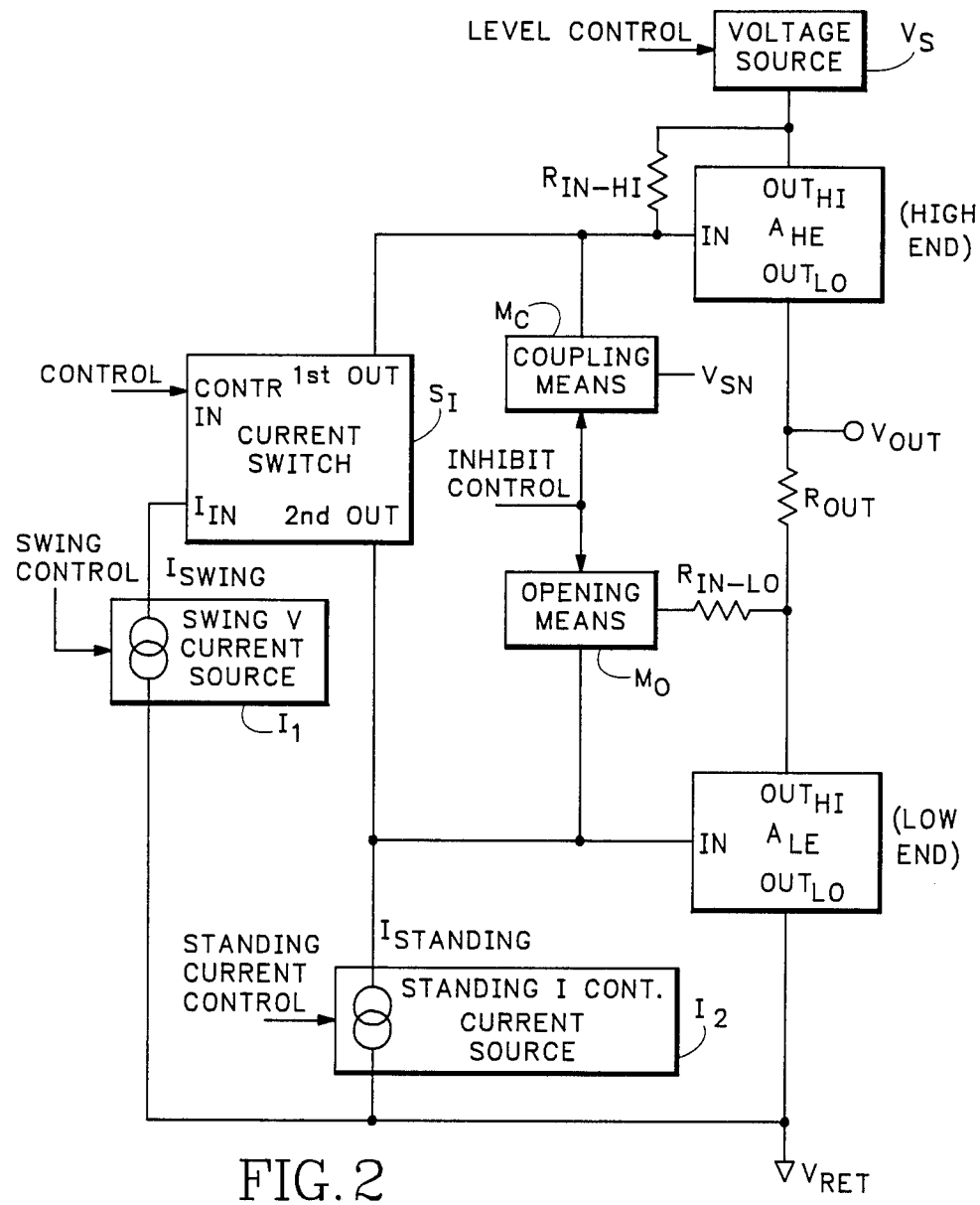
FIG. 2 is a schematic and block diagram of the invention, with inhibit control circuitry added.

Referring to FIG. 2, additional circuitry can be added to allow the circuitry described above to be put in a high impedance condition (tri-stated). Opening means M-o is put in series with the low input resistor R-in-lo, and means for coupling the input of the high end transconductance amplifier to a voltage which is low enough to turn it off is also added. These assure that when an inhibit control signal is activated both transconductance amplifiers are turned off and the alternative low impedance path through the low input resistor is opened, so that the output resistor R-out is isolated from the rest of the circuitry to present a high impedance at the output V-out.

Figure 3:
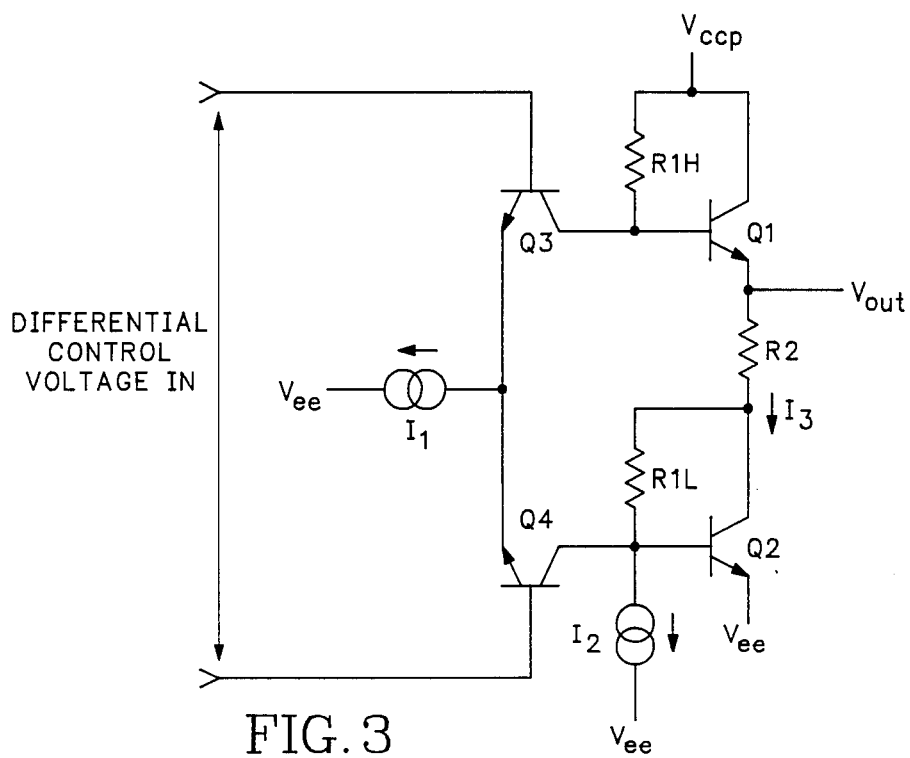
FIG. 3 is a schematic diagram of the invention implemented in n-p-n transistors.

Referring to FIG. 3, the circuitry of FIG. 1 is shown implemented in n-p-n transistors as in a simplified version of the preferred embodiment Two matched transistors, high end transistor Q1 and low end transistor Q2, correspond to the two transconductance amplifiers A-he/A-le of FIGS. 1 and 2, and are connected in series with output resistor R2 to form the same voltage dividing network. The top of this network is connected to a programmable voltage source V-ccp, the bottom to the substrate voltage V-ee. The output of the circuit V-out is taken from the junction of the emitter of high end transistor Q1 and the high end transistor end of the output resistor R2.

Each output transistor has one of a pair of matched input resistors RlH/RlL across its base and collector. The base of high end transistor Q1 is connected to the collector of high-side current switch transistor Q3. The emitter of high-side current switch transistor Q3 is connected to swing voltage constant current source I1, as is the emitter of low-side current switch transistor Q4. The collector of the low-side current switch transistor Q4 is connected to the base or low end transistor Q2. The bases of the two current switch transistors Q3/Q4 are connected to the two sides of a differential control input signal.

A standing current control current source I2 is connected to the junction of the base of the low end transistor Q2 and the collector of the low-side current switch transistor Q4.

The high level of the voltage output V-out is controlled by the voltage V-ccp applied to the collector of the high end transistor Q1 minus the base-mitter drop of this transistor:

$$V\text{-out-high} = V\text{-ccp} - V\text{-be-q1}$$

The current from the voltage swing constant current source I1 is routed through one of the two equal input resistors R1H/R1L by high-side and low-side current switch transistors Q3/Q4 in response to the differential data control signals D/D-not. When this current is routed through the high input resistor R1H of the high end transistor Q1, the resulting voltage, which is the product of the swing current times the value of R1H, causes the output voltage V-out to decrease by that amount.

The magnitude of the voltage swing between the high level of the voltage output and the low level of the voltage output is controlled by the amount of current from the swing voltage constant current source I1 times the value of one of the matched input resistors R1H/R1L.

$$V\text{-swing} = V\text{-out-high} - V\text{-out-low} = I1 * R1$$

The standing current control current source I2 creates an additional current through the low input resistor R1L. The voltage developed across this resistor also appears as an increase in voltage across the low end transistor Q2 to raise the voltage at the low end of output resistor R2 and thereby reduce the current through that resistor, keeping this standing current within reasonable limits that are controllable by varying I2.

$$I\text{-r2} = 1/R2 * (V\text{-ccp} - V\text{-ee} - R1(I1+I2) - V_{be,q1} - V_{be,q2})$$

The impedance seen by the circuitry connected to the output is virtually the same for both high and low conditions of the output signal. In part this is because the two transistors Q1 and Q2 are matched for optimum operation, so they have stray capacitance values that are approximately equal, thus contributing to the equal impedance of the output during transitions in both directions. Moreover, by controlling the standing current control current source, Q1 and Q2 are kept from turning off completely even when they are put in a state of minimum conduction by the action of the swing current, and this helps to keep the impedance of Q1 as seen from its emitter approximately equal to the impedance of Q2 as seen from its collector.

Figure 4:
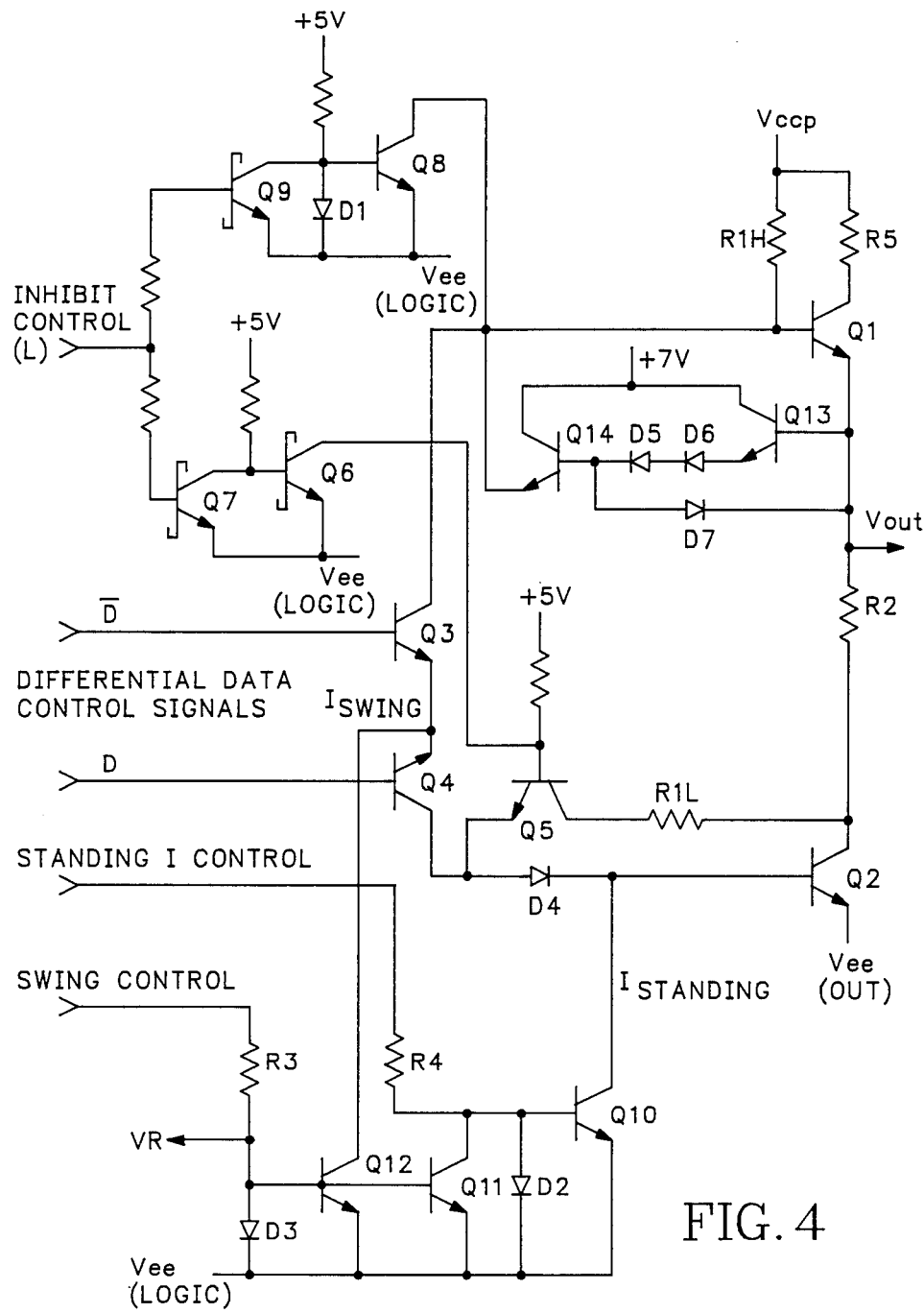
FIG. 4 is a schematic diagram of the invention, including inhibit control and static and shorting protection.

Referring now to FIG. 4, the inhibit control circuitry of FIG. 2 is shown here in the n-p-n implementation, as are several other features to be discussed later.

The opening means M-o of FIG. 2 may be seen in FIG. 4 as series transistor Q5 and the two Schottky transistors which control its input Q6/Q7. The coupling means of FIG. 2 may be seen in FIG. 4 as the coupling transistor Q8 and the diode D1 and Schottky transistor Q9 which control Q8.

When an inhibit control (active low) signal causes the bases of Q7 and Q9 to go low, the series transistor Q5 opens the path through R1L and the coupling transistor Q8 conducts. The conduction of coupling transistor Q8 pulls the base of the high end transistor Q1 to a voltage which is sufficiently negative to ensure that it stays shut off. Low end transistor Q2 is maintained in a non-conducting condition by the action on its base of standing current control transistor Q10 (whose normal operation will be explained below) and the opening of the path through input resistor R1L.

While the output is tri-stated and the coupling transistor Q8 is holding the base of Q1 low by applying a voltage close to V-ee, a high positive voltage on the output could cause a reverse bias across the base-emitter junction of Q1 that would be sufficient to exceed its breakdown voltage and cause that transistor to be damaged. Reverse voltage clamping circuitry Q13, D6, D5, and Q14 operate to permit a maximum of four diode drops of reverse bias across the base-emitter junction of transistor Q1. Transistors Q14 and Q13 are in a Darlington configuration, with the diodes between them merely adding to the threshold necessary for the network to be forward biased. These extra diode drops increase the range over which the output has a maximum of high impedance, since when this reverse voltage clamping circuitry turns on the high impedance of the output is somewhat decreased.

When the inhibit coupling transistor Q8 is not conducting, and the output has been in a high condition with Q1 on, the stray capacitance associated with the base of transistor Q14 will be charged. This charge on the base of Q14 will tend to keep its emitter voltage from falling as quickly as is desired when high-side current switch transistor Q3 turns on to pull the base of high end transistor Q1 low. Diode D7 operates to provide a discharge path for this capacitance, keeping the base of Q14 at approximately the same voltage as the base of Q1 and thereby helping Q14 to shut off as the base and emitter of Q1 go low in response to the operation of Q3. During periods of inhibited (tri-stated) operation, diode D7 will be reversed biased and irrelevant to the activity of the circuit.

Biasing diode D4, by adding another diode drop in series with the base-emitter junction of Q2, serves to raise the path from the collector of Q4 through the base-emitter of Q2 to approximately the same level as the collector of Q4, which is up two diode drops above V-ee due to the base-emitter drops of Q4 and Q12.

The swing voltage current source I1 of FIGS. 1 and 2 may be seen in FIG. 4 as Q12, D3, and R3, which is controlled by the swing control signal from a digital to analog converter (not shown). Similarly, the standing current control current source I2 of FIGS. 1 and 2 may be seen in FIG. 4 as Q10, D2, and R4, which is controlled by the standing current control signal from another digital to analog converter (not shown) and by the subtraction transistor Q11. The implementation shown in FIG. 4 differs at this point from the idealized version of the invention shown in FIGS. 1 and 2. Subtraction transistor Q11 performs the function of making the actual standing current increase and decrease inversely with changes in the swing voltage current such that their sum remains constant. Thus, the input standing current control represents the total amount of current through the output resistor R2, with only the difference between that value and the swing voltage current value being supplied by the standing current path.

Short protection resistor R5 is added in the collector circuit of the high end transistor Q1 to limit the current which can flow when the high end transistor Q1 is on and the output V-out is shorted. The output resistor R2 serves this function when the low end transistor Q2 is on and the output is shorted to a positive supply.

It should be understood that while the circuit of the preferred embodiment is illustrative of the concept of the invention, other embodiments will be readily apparent to those skilled in the art. In particular, single transistor transconductance amplifiers have been used here, but in other applications it might be desirable to use multiple transistor amplifiers, or other types of devices that fit within the broad class of transconductance amplifiers.

I claim:

1. A circuit for producing an output signal that switches between a high level and a low level in response to a control signal, the circuit comprising:
    an output resistor having a high end and a low end, the output signal being taken from the high end;
    a high end transconductance amplifier having an input, a high output, and a low output, with the high output coupled to a voltage source and the low output coupled to the high end of the output resistor;
    a high input resistor coupled between the input of the high end transconductance amplifier and the high output of the high end transconductance amplifier;
    a low end transconductance amplifier having an input, a high output, and a low output, with the high output coupled to the low end of the output resistor and the low output coupled to a return voltage;
    a low input resistor coupled between the input of the low end transconductance amplifier and the high output of the low end transconductance amplifier;
    a swing voltage current source having an input and an output, with the input coupled to the return voltage;
    a current switch having a current input, a control input, a first current output, and a second current output, with the current input receiving current from the output of the swing voltage current source, the first current output providing current to the end of the high input resistor that is connected to the input of the high end transconductance amplifier when the control input is in a first condition, and the second current output providing current to the end of the low input resistor that is connected to the input of the low end transconductance amplifier when the control input is in a second condition, such that the output signal goes to the low level when the current is provided to the high input resistor and the output signal goes to the high level when the current is provided to the low input resistor; and
    a standing current control current source having an input and an output, with its input coupled to the return voltage and its output coupled to the input of the low end transconductance amplifier so as to provide a means for reducing flow of a standing current through the output resistor.

2. A circuit as recited in claim 1 further comprising:
    means for opening inserted in series with the low input resistor; and
    means for coupling the input of the high end transconductance amplifier to a voltage which is sufficiently negative to turn it off;
    whereby activating the opening means and the coupling means will cause both the high end transconductance amplifier and the low end transconductance amplifier to go to a state of minimum conduction and eliminate any other low impedance paths from the output resistor through the circuit so as to cause the signal output to go to a high impedance condition.

3. A circuit as recited in claim 2 further comprising means for clamping reverse voltage coupled between the low output of the high end transconductance amplifier and the input of the high end transconductance amplifier so as to prevent large reverse voltages which may occur when the signal output is caused to go to the high impedance condition from damaging the high end transconductance amplifier.

4. A circuit as recited in claim 1 wherein the transconductance amplifiers include a transistor.

5. A circuit as recited in claim 1 wherein the current switch includes a differential pair of transistors.

6. A circuit as recited in claim 2 wherein the opening means includes a transistor.

7. A circuit as recited in claim 2 wherein the coupling means includes a current source.

8. A circuit as recited in claim 3 wherein the reverse voltage clamping means includes a transistor.

* * * * *